United States Patent
Lo et al.

(10) Patent No.: US 11,467,488 B2
(45) Date of Patent: Oct. 11, 2022

(54) SEMICONDUCTOR APPARATUS AND METHOD OF OPERATING THE SAME

(71) Applicant: TAIWAN SEMICONDUCTOR MANUFACTURING CO., LTD., Hsinchu (TW)

(72) Inventors: Wen Lo, Taipei (TW); Shih-Ming Chang, Hsinchu County (TW); Chun-Hung Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 662 days.

(21) Appl. No.: 16/441,158

(22) Filed: Jun. 14, 2019

(65) Prior Publication Data

US 2020/0393752 A1 Dec. 17, 2020

(51) Int. Cl.
| | |
|---|---|
| *G03F 1/78* | (2012.01) |
| *H01J 37/09* | (2006.01) |
| *H01J 37/317* | (2006.01) |
| *H01J 37/10* | (2006.01) |

(52) U.S. Cl.
CPC .............. *G03F 1/78* (2013.01); *H01J 37/09* (2013.01); *H01J 37/3174* (2013.01); *H01J 37/10* (2013.01); *H01J 2237/0451* (2013.01); *H01J 2237/31776* (2013.01)

(58) Field of Classification Search
CPC ... G03F 1/78; H01J 37/09; H01J 37/10; H01J 37/3174; H01J 2237/0451; H01J 2237/31776
See application file for complete search history.

(56) References Cited

U.S. PATENT DOCUMENTS

| | | | | |
|---|---|---|---|---|
| 5,886,357 A | * | 3/1999 | Kojima | .................. B82Y 10/00 250/397 |
| 7,714,308 B2 | * | 5/2010 | Hiroshima | .......... H01J 37/1472 250/492.23 |
| 8,796,666 B1 | | 8/2014 | Huang et al. | |
| 8,945,803 B2 | | 2/2015 | Chen et al. | |
| 8,987,689 B2 | | 3/2015 | Chen et al. | |
| 9,093,530 B2 | | 4/2015 | Huang et al. | |
| 9,269,537 B2 | | 2/2016 | Tseng et al. | |
| 9,305,799 B2 | | 4/2016 | Chen et al. | |
| 9,336,993 B2 | | 5/2016 | Yu | |
| 9,367,661 B2 | | 6/2016 | Jou et al. | |
| 9,529,959 B2 | | 12/2016 | Wang et al. | |
| 9,548,303 B2 | | 1/2017 | Lee et al. | |

(Continued)

FOREIGN PATENT DOCUMENTS

JP 2000068180 A * 3/2000

OTHER PUBLICATIONS

U.S. Appl. No. 16/138,402 as filed (copy not attached).

*Primary Examiner* — David E Smith
(74) *Attorney, Agent, or Firm* — Birch, Stewart, Kolasch & Birch, LLP

(57) ABSTRACT

A method of operating a semiconductor apparatus includes forming a first electron beam passing through a first shaping aperture; modifying an energy distribution of the first electron beam by a second shaping aperture, such that the first electron beam has a main region and an edge region having a greater energy than the main region; and exposing a workpiece to the main region and the edge region of the first electron beam to create a pattern.

20 Claims, 24 Drawing Sheets

(56) References Cited

U.S. PATENT DOCUMENTS

| | | | | |
|---|---|---|---|---|
| 2009/0008579 A1* | 1/2009 | Takeya | ................... | B82Y 40/00 250/492.23 |
| 2012/0288787 A1* | 11/2012 | Choi | ......................... | G03F 1/78 430/5 |
| 2012/0329289 A1* | 12/2012 | Fujimura | ................... | G03F 1/20 257/E21.328 |
| 2014/0359542 A1* | 12/2014 | Fujimura | ................... | G03F 1/36 716/53 |

* cited by examiner

US 11,467,488 B2

SEMICONDUCTOR APPARATUS AND METHOD OF OPERATING THE SAME

BACKGROUND

The semiconductor integrated circuit (IC) industry has experienced rapid growth. Technological advances in IC materials and design have produced generations of ICs. Each generation has smaller and more complex circuits than the previous generation. In semiconductor manufacturing technology, electron beam (e-beam) lithography is commonly used to create a complex pattern on a reticle. Generally, electrons from electron source are accelerated and focused in the shape of a beam toward the reticle. The electron beam is scanned in the desired pattern across an e-beam resist on the reticle. During e-beam lithography, multiple shots are performed in order to create a pattern on the reticle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
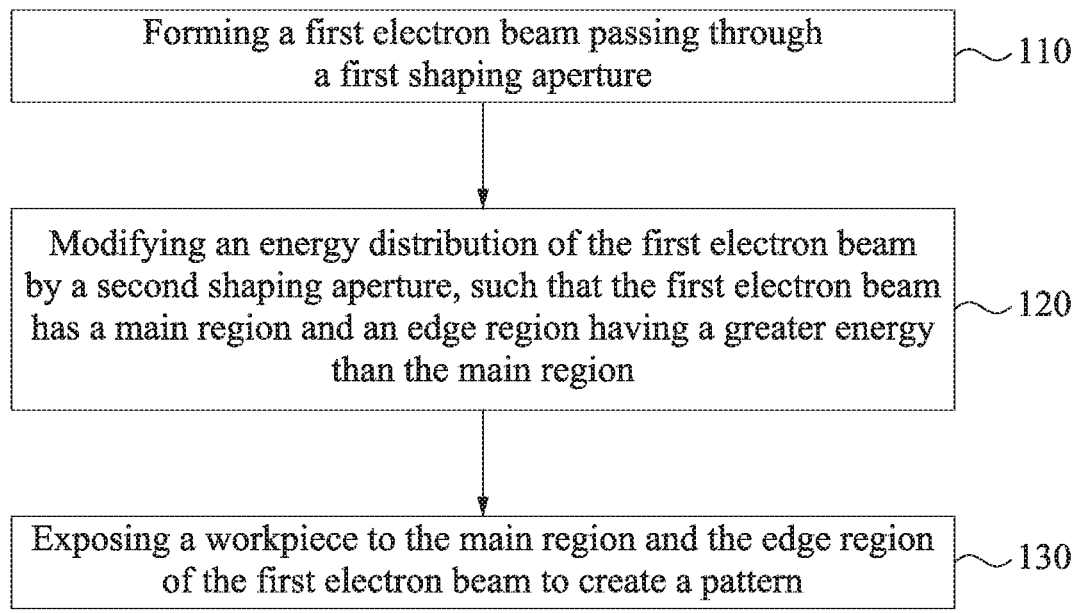
FIG. 1 is a flow chart of a method of operating a semiconductor apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a flow chart of a method of operating a semiconductor apparatus in accordance with some embodiments of the present disclosure. The method begins with block 110 in which a first electron beam passing through a first shaping aperture is formed. The method continues with block 120 in which an energy distribution of the first electron beam is modified by a second shaping aperture, such that the first electron beam has a main region and an edge region that has a greater energy than the main region. The method continues with block 130 in which a workpiece is exposed to the main region and the edge region of the first electron beam to create a pattern. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
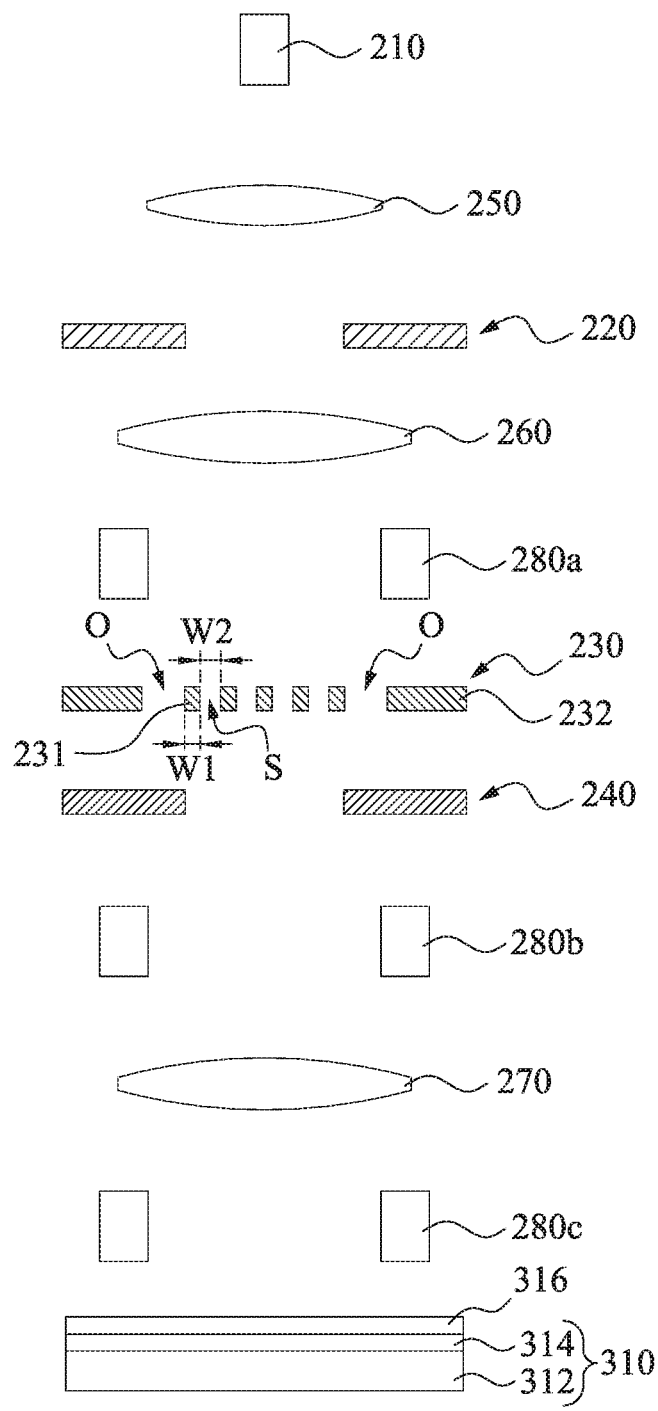
FIG. 2 is a cross-sectional view of a semiconductor apparatus in accordance with some embodiments of the present disclosure.

FIG. 2 is a cross-sectional view of a semiconductor apparatus 200 in accordance with some embodiments of the present disclosure. The semiconductor apparatus 200 may be a variable shaped beam (VSB) writer which is configured to create a pattern on a workpiece 310. In some embodiments, the workpiece 310 is a reticle (or a photomask). The semiconductor apparatus 200 includes a radiation source 210, a first shaping aperture 220 below the radiation source 210, and a second shaping aperture 230 below the first shaping aperture 220. The radiation source 210, such as an electron gun, is configured to generate an electron beam to pass through the underlying first shaping aperture 220 and second shaping aperture 230, such that the reticle 310 is exposed to an overlapping portion of the first shaping aperture 220 and the second shaping aperture 230. In other words, a photoresist layer 316 over the reticle 310 may receive the electron beam that passes through the first shaping aperture 220 and the second shaping aperture 230, and a pattern can be formed in the photoresist layer 316 by the electron beam. In some embodiments, the semiconductor apparatus 200 further includes a third shaping aperture 240 to allow a portion of the electron beam to be projected onto the reticle 310, and thus the reticle 310 is exposed to an overlapping portion of the first shaping aperture 220, the second shaping aperture 230, and the third shaping aperture 240.

Moreover, the semiconductor apparatus 200 may further include optical elements, such as a condenser lens 250, a projector lens 260, an objective lens 270, and deflectors 280a, 280b, and 280c. The condenser lens 250 is configured to aid in directing the electron beam from the radiation source 210. The projector lens 260 is configured to project the electron beam that passes through the first shaping aperture 220. The objective lens 270 is configured to project the electron beam onto the reticle 310 to create a pattern. The deflectors 280a, 280b, and 280c are configured to deflect the electron beam, such that the electron beam can be correctly projected onto a desired region.

Figure 3A:
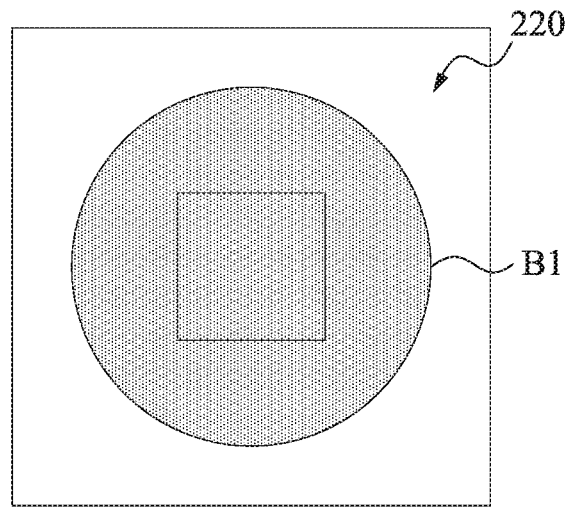
FIG. 3A is a top view of an electron beam transmitted to a first shaping aperture of FIG. 2 in accordance with some embodiments of the present disclosure.

FIG. 3A is a top view of an electron beam B1 transmitted to the first shaping aperture 220 of FIG. 2 in accordance with some embodiments of the present disclosure. When the radiation source 210 of FIG. 2 generates an electron beam B1, a portion of the electron beam B1 (e.g., a central portion) passes through the first shaping aperture 220, and another portion (e.g., a peripheral portion) of the electron beam B1 is blocked. In some embodiments, the first shaping aperture 220 includes a rectangular opening, such as a square opening, but the present disclosure is not limited in this regard. After the electron beam B1 passes through the first shaping aperture 220, the electron beam B1 may have a shape corresponding to the opening of the first shaping aperture 220. As a result, the remaining portion of the electron beam B1 is continuously transmitted toward the underlying components. For example, the remaining portion of the electron beam B1 is the electron beam B11 of FIG. 3B.

Figure 3B:
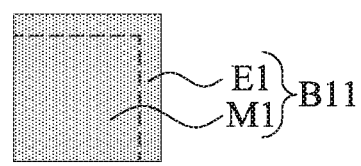
FIG. 3B is a top view of the electron beam of FIG. 3A after passing through the first shaping aperture.
Figure 4A:
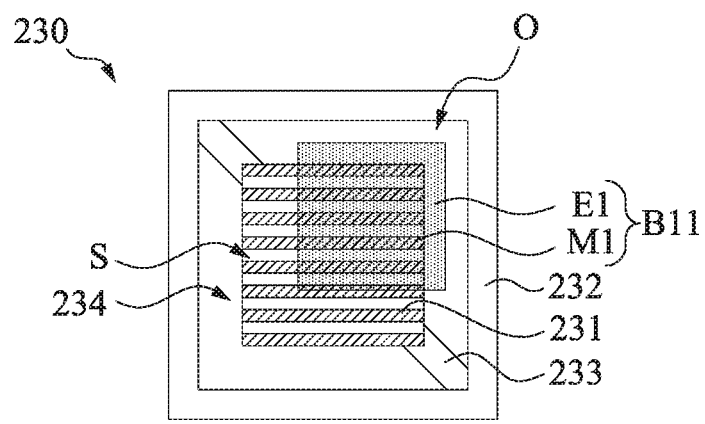
FIG. 4A is a top view of the electron beam of FIG. 3B transmitted to a second shaping aperture.

FIG. 4A is a top view of the electron beam B11 of FIG. 3B transmitted to the second shaping aperture 230. In some embodiment, the electron beam B11 is projected on a position of the second shaping aperture 230 (e.g., an upper right region). The electron beam B11 passing through the first shaping aperture 220 has a main region M1 and an edge region E1 The second shaping aperture 230 is configured to modify the energy distribution of the electron beam B11. In some embodiments, the second shaping aperture 230 includes conductive strips 231 with slots S therebetween, and may further include a frame 232 and a diagonal support 233 to support the conductive strips 231. Each slot S is between two adjacent conductive strips 231. The frame 232 surrounds the conductive strips 231. Two ends of the diagonal support 233 is connected to a corner of the frame 232 and at least one of the conductive strips 231, such that an L-shaped opening O is among the frame 232, the diagonal support 233, and the conductive strips 231. As a result of such a configuration, the conductive strips 231 and the slots S act as a barrier structure 234 to partially block the main region M1 of the electron beam B11, and portions of the main region M1 of the electron beam B11 can pass through the second shaping aperture 230 due to the slots S. Therefore, the energy intensity of the main region M1 of the electron beam B11 is reduced by the combination of the conductive strips 231 and the slots S (i.e., the barrier structure 234) of the second shaping aperture 230. In some embodiments, the conductive strips 231 are made of a material including metal for blocking electron beams, such as tungsten (W) or the like. Moreover, austenitic stainless steel, mild steel, aluminum and aluminum alloys may also be selectively used to make the conductive strips 231, in which austenitic stainless steel is suitable for a high vacuum system, and mild steel can be used for moderate vacuums in a range from about 6 torr to about 10 torr. The frame 232 and the diagonal support 233 are made of iron or a metal used in the conductive strips 231. In alternative embodiments, the frame 232, the diagonal support 233, and the conductive strips 231 may be integrally formed as a single piece.

In addition, since the second shaping aperture 230 has the L-shaped opening O between the barrier structure 234 (i.e., the conductive strips 231 with the slots S therebetween) and the frame 232, the edge region E1 of the electron beam B11 can pass through the L-shaped opening O1 without blocking. In other words, the L-shaped opening O enables the edge region E1 of the electron beam B11 to pass through the second shaping aperture. As a result, the energy intensity of the edge region E1 of the electron beam B11 can be maintained due to the L-shaped opening O of the second shaping aperture 230. The remaining portion of the electron beam B11, such as the electron beam B12 of FIG. 4B, is continuously transmitted toward the underlying components.

Figure 4B:
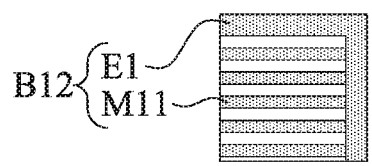
FIG. 4B is a top view of the electron beam of FIG. 4A after passing through the second shaping aperture.

Reference is made to FIG. 4B. The main region M11 of the electron beam B12 is formed by passing through the slots S of the second shaping aperture 230. Stated differently, the main region M1 of FIG. 4A is partially blocked by the conductive strips 231 to form the main region M11 of the electron beam B12. Therefore, the edge region E1 of the electron beam B12 has a greater energy than the main region M11 of the electron beam B12. A non-uniform energy distribution of the electron beam B12 can be obtained, in which the edge region E1 of the electron beam B12 adjacent to two sides of the main region M11 has an enhanced intensity relative to the main region M11. In some embodiments, the edge region E1 is L-shaped, and the main region M11 is square, but the present disclosure is not limited in this regard.

In some embodiments, as shown in FIG. 2, each of the conductive strips 231 has a width W1, and each of the slots S has a width W2 subsequently the same as the with W1, such that the width/space ratio of the barrier structure 234 is about 1:1. As a result, the barrier structure 234 may have about 50% transmissive rate, but the present disclosure is not limited in this regard. The transmissive rate can be varied depending on the design of the second shaping aperture 230. For example, the ratio for an electron beam to pass through the barrier structure 234 of the second shaping aperture 230 may be varied by adjusting the width W1 of the conductive strips 231 and/or the width W2 of the slots S, such that the energy intensity of the main region M11 of the electron beam B12 can be controlled.

Figure 5A:
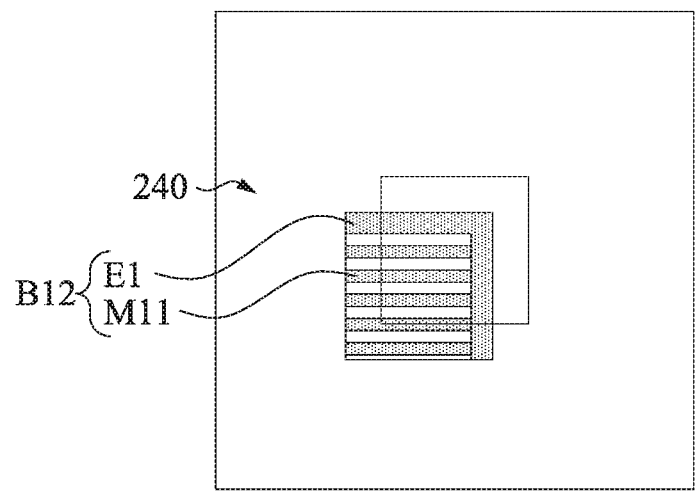
FIG. 5A is a top view of the electron beam of FIG. 4B transmitted to a third shaping aperture.
Figure 5B:
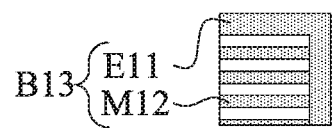
FIG. 5B is a top view of the electron beam of FIG. 5A after passing through the third shaping aperture.

FIG. 5A is a top view of the electron beam B12 of FIG. 4B transmitted to the third shaping aperture 240. The electron beam B12 has the main region M11 and the edge region E1. The third shaping aperture 240 is below the second shaping aperture 230 (see FIG. 2 or 4A), and is configured to allow a desired portion of the electron beam B12 to be projected onto the reticle 310 of FIG. 2. In some embodiments, the third shaping aperture 220 includes a rectangular opening (e.g., a square opening), but the present disclosure is not limited in this regard. A portion of the main region M11 and a portion of the edge region E1 of the electron beam B12 can pass through the third shaping aperture 240. In other words, the third shaping aperture 240 partially blocks the electron beam B12 that previously passes through the second shaping aperture 230. After the electron beam B12 passes through the third shaping aperture 240, the remaining portions of the main region M11 and the edge region E1 of the electron beam B12 may have a shape and a size based on the relative position of the electron beam B12 and the third shaping aperture 240. As a result, the remaining portion of the electron beam B12, such as the electron beam B13 of FIG. 5B, is continuously transmitted toward the reticle 310 of FIG. 2. In some embodiments, the size of the electron beam B13 of FIG. 5B is smaller than the size of the electron beam B12 of FIG. 4B.

Reference is made to FIG. 2 and FIG. 5B. The electron beam B13 is projected onto the reticle 310, such that the reticle 310 is exposed to the main region M12 and the edge region E11 of the electron beam B13 to create a pattern. In some embodiments, when the transmissive rate of the barrier structure 234 of the second shaping aperture 230 is about 50%, the main region M12 of the electron beam B13 can project about 50% (energy) dosage on a position of the reticle 310, and the edge region E11 of the electron beam B13 can project about 100% dosage on another position of the reticle 310. In some embodiments, the electron beam B13 may irradiates the reticle 310 about 20 s, but the present disclosure is not limited in this regard.

In some embodiments, the reticle 310 is exposed to an overlapping portion of the first shaping aperture 220, the second shaping aperture 230, and the third shaping aperture 240. This exposure creates a pattern on the reticle 310. The reticle 310 includes a substrate 312 and a mask layer 314 over the substrate 312. A resist layer 316 is formed over the mask layer 314. Is some embodiments, the substrate 312 may be made of a material including quartz, silica, or the like, The mask layer 314 may be made of a material including chromium or the like. The resist layer 316 may be a positive-tone poly or a chemically amplified resist, but the present disclosure is not limited in this regard. After the exposure of the electron beam B13 to the resist layer 316, a pattern corresponding to the shape of the electron beam B13 can be formed in the resist layer 316.

In alternative embodiments, the semiconductor apparatus 200 may have no third shaping aperture 240 to enable the main region M11 and the edge region E1 of the electron beam B12 of FIG. 4B to be projected onto the reticle 310, such that the reticle 310 is exposed to an overlapping portion of the first shaping aperture 220 and the second shaping aperture 230.

Figure 6A:
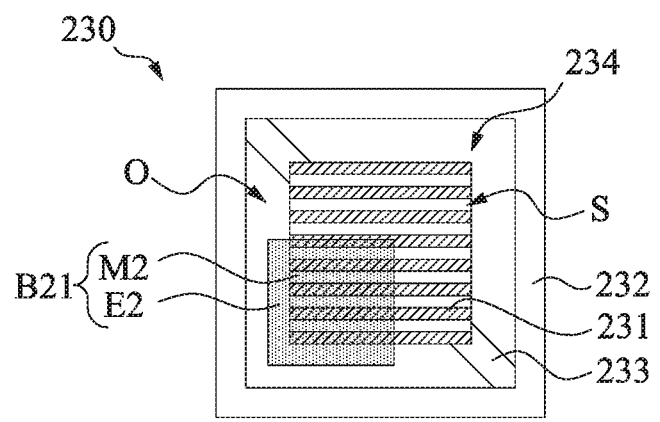
FIG. 6A is top view of another electron beam transmitted to the second shaping aperture in accordance with some embodiments of the present disclosure.

FIG. 6A is top view of another electron beam B21 transmitted to the second shaping aperture 230 in accordance with some embodiments of the present disclosure. After the electron beam B13 of FIG. 5B is projected on the reticle 310 of FIG. 2, the radiation source 210 of FIG. 2 further generates the electron beam B21, in which a path of the electron beam B21 may be controlled by the radiation source 210. The electron beam B21 has passed through the first shaping aperture 220. The formation of the electron beam B21 is similar to that of the electron beam B11 of FIG. 3B, and will not be repeated. However, the electron beam B21 is projected on a different position of the second shaping aperture 230 (e.g., a lower left region) from the electron beam B11 of FIG. 4A. The electron beam B21 passing through the first shaping aperture 220 has a main region M2 and an edge region E2. The second shaping aperture 230 is configured to modify the energy distribution of the electron beam B21. The conductive strips 231 partially block the main region M2 of the electron beam B21, and portions of the main region M2 of the electron beam B21 can pass through the second shaping aperture 230 due to the slots S. Therefore, the energy intensity of the main region M2 of the electron beam B21 is reduced by the conductive strips 231 and the slots S of the second shaping aperture 230.

In addition, the edge region E2 of the electron beam B21 can pass through the L-shaped opening O1 without blocking. In other words, the L-shaped opening O enables the edge region E2 of the electron beam B21 to pass through the second shaping aperture 230. As a result, the energy intensity of the edge region E2 of the electron beam B21 can be maintained due to the L-shaped opening O of the second shaping aperture 230. Further, the remaining portion of the electron beam B21, such as the electron beam B22 of FIG. 6B, is continuously transmitted toward the underlying components.

Figure 6B:
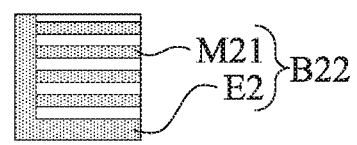
FIG. 6B is a top view of the electron beam after passing through the second shaping aperture.
Figure 7A:
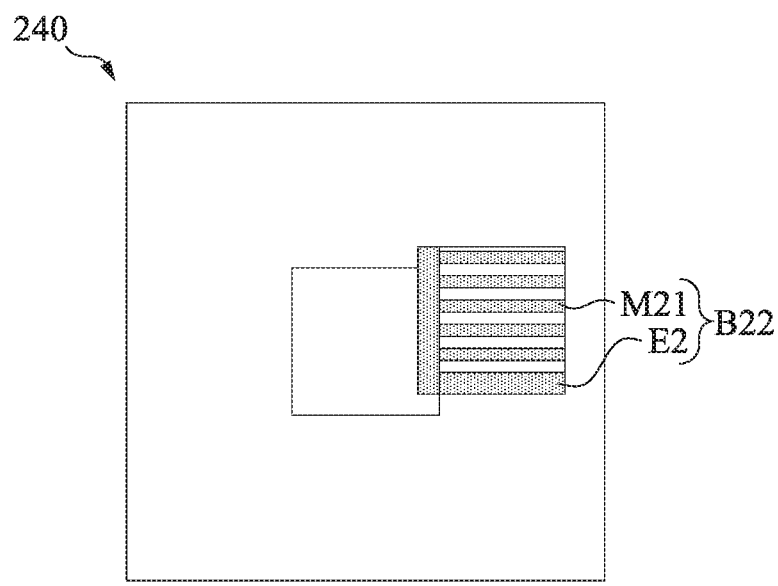
FIG. 7A is a top view of the electron beam of FIG. 6B transmitted to the third shaping aperture.

FIG. 7A is a top view of the electron beam B22 of FIG. 6B transmitted to the third shaping aperture 240. The electron beam B22 has the main region M21 and the edge region E2. The third shaping aperture 240 is configured to allow a desired portion of the electron beam B22 to be projected onto the reticle 310 of FIG. 2. In some embodiments, a portion of the edge region E2 of the electron beam B22 can pass through the third shaping aperture 240. In other words, the third shaping aperture 240 blocks the main region M21 and another portion of the edge region E2. As a result, the remaining portion of the electron beam B22, such as the electron beam B23 of FIG. 7B, is continuously transmitted toward the reticle 310 of FIG. 2.

Figure 7B:
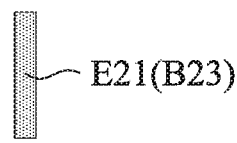
FIG. 7B is a top view of the electron beam of FIG. 7A after passing through the third shaping aperture.

Reference is made to FIG. 2 and FIG. 7B. The edge region E21 of the electron beam B23 is projected onto the reticle 310, such that the reticle 310 is exposed to the edge region E21 to create a pattern. This exposure creates another pattern on the reticle 310. After the exposure of the electron beam B23 to the resist layer 316, a pattern corresponding to the shape of the electron beam B23 can be formed in the resist layer 316. In some embodiments, the edge region E21 of the electron beam B23 can project about 100% dosage on a position of the reticle 310, in which the electron beam B23 may irradiates the reticle 310 about 20 s.

Figure 8A:
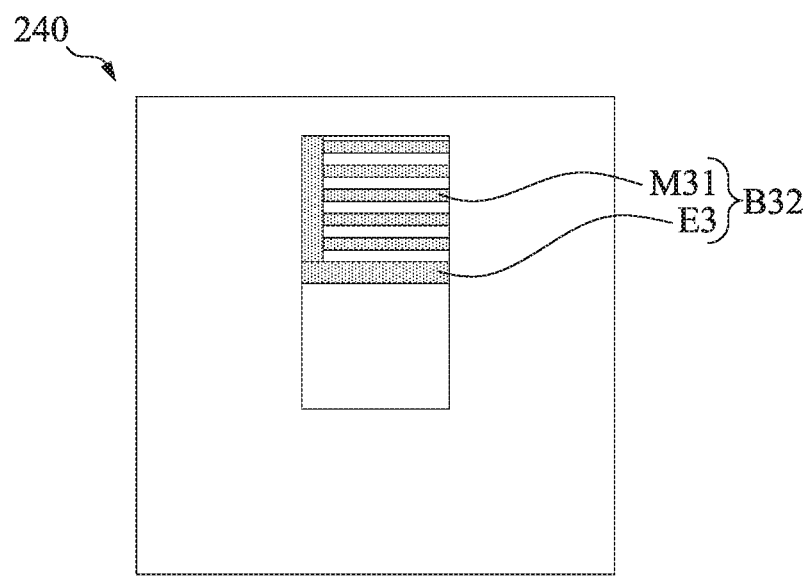
FIG. 8A is a top view of another electron beam transmitted to the third shaping aperture in accordance with some embodiments of the present disclosure.

FIG. 8A is a top view of another electron beam B32 transmitted to the third shaping aperture 240 in accordance with some embodiments of the present disclosure. The formation of the electron beam B32 is similar to that of the electron beam B22 of FIG. 6B, and will not be repeated. However, the electron beam B32 is projected on a different position of the third shaping aperture 240 (e.g., an upper region) from the electron beam B22 of FIG. 7A (e.g., a right region). The electron beam B32 has the main region M31 and the edge region E3. The third shaping aperture 240 is configured to allow a desired portion of the electron beam B32 to be projected onto the reticle 310 of FIG. 2. In some embodiments, a portion of the edge region E3 of the electron beam B32 can pass through the third shaping aperture 240. In other words, the third shaping aperture 240 blocks the main region M31 and another portion of the edge region E3. As a result of such a design, the remaining portion of the electron beam B32, such as the electron beam B33 of FIG. 8B, is continuously transmitted toward the reticle 310 of FIG. 2.

Figure 8B:
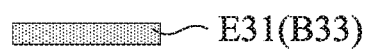
FIG. 8B is a top view of the electron beam of FIG. 8A after passing through the third shaping aperture.

Reference is made to FIG. 2 and FIG. 8B. The edge region E31 of the electron beam B33 is projected onto the reticle 310, such that the reticle 310 is exposed to the edge region E31 to create a pattern. This exposure creates another pattern on the reticle 310. After the exposure of the electron beam B33 to the resist layer 316, a pattern corresponding to the shape of the electron beam B33 can be formed in the resist layer 316. In some embodiments, the edge region E31 of the electron beam B33 can project about 100% dosage on a position of the reticle 310, in which the electron beam B33 may irradiates the reticle 310 about 20 s.

Figure 9:
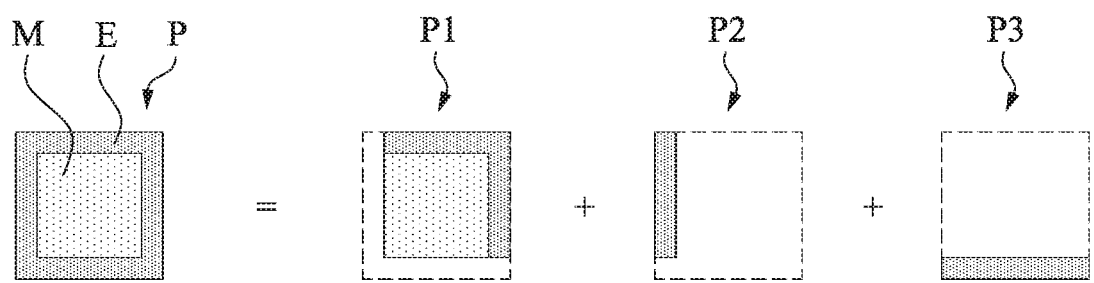
FIG. 9 is schematic view of a combination of patterns formed by electron beams of FIGS. 5B, 7B, and 8B.

FIG. 9 is schematic view of a combination of patterns P1, P2, and P3 formed by the electron beams B13, B23, and B33 of FIGS. 5B, 7B, and 8B. As mentioned above, there are three shots of the radiation source 210 (see FIG. 2) to respectively create three patterns P1, P2, and P3 on the reticle 310 of FIG. 2, in which the pattern P1 is formed by the electron beam B13 of FIG. 5B, the pattern P2 is formed by the electron beam B23 of FIG. 7B, and the pattern P3 is formed by the electron beam B33 of FIG. 8B. The path of the electron beam B23 may be controlled by the radiation source 210, such that the orthogonal projection of the edge region E21 of the electron beam B23 on the reticle 310 is adjacent to the orthogonal projection of the main region M12 and the edge region E11 of the electron beam B13 on the reticle 310. For example, the orthogonal projection of the edge region E21 of the electron beam B23 on the reticle 310 is adjacent to the left side of the pattern P1.

Moreover, the path of the electron beam B33 may be controlled by the radiation source 210, such that the orthogonal projection of the edge region E31 of the electron beam B33 on the reticle 310 is adjacent to the orthogonal projection of the main region M12 and the edge region E11 of the electron beam B13 on the reticle 310, and is adjacent to the orthogonal projection of the edge region E21 of the electron beam B23 on the reticle 310. For example, the orthogonal projection of the edge region E31 of the electron beam B33 on the reticle 310 is adjacent to the lower side of the pattern P1 and the lower side of the pattern P2.

As a result, a pattern P including the patterns P1, P2, and P3 is formed in the photoresist layer 316 on the reticle 310 of FIG. 2 by the aforementioned three shots. Thereafter, an etch process may be performed on the mask layer 314 based on the pattern P. The pattern P has a main region M and an edge region E that surrounds the main region M. The edge region E is formed by the projections of the edge region E11 of FIG. 5B, the edge region E21 of FIG. 7B, and the edge region E31 of FIG. 8B, while the main region M is formed by the projection of the main region M12 of FIG. 5B. The contrast improvement is realized because the dosage of forming the edge region E (e.g., about 100% dosage) is about the double of forming the main region M (e.g., about 50% dosage). In some embodiments, the dosage of forming the edge region E may be in a range from about 80% to about 200%, and the dosage of forming the main region M may be in a range from about 20% to about 80%. The edge region E may have a width in a range from about 5 nm to about 30 nm. Due to the second shaping aperture 230 (see FIG. 4A), the main region M12 has energy intensity less than the energy intensity of the edge region E11, the edge region E21, and the edge region E31. Stated differently, the edge region E11, the edge region E21, and the edge region E31 have greater energy intensity than the main region M12, such that an electrical optics scheme with regional intensity modulation for variable shaped beam (VSB) charged particle writing system (e.g., the semiconductor apparatus 200 of FIG. 2) can be achieved. As a result, the pattern P with edge enhancement intensity distribution can be obtained, and thus the contrast of the image after mask process correction (MPC) can be increased.

The semiconductor apparatus 200 and the method of operating the same (see FIGS. 1 and 2) can produce different types of shaped beam (i.e., variable shaped beam) with modified intensity distribution instead of traditional uniform energy distribution, and can be co-optimized with fracturing software for better performance. The number of shots can be decreased because the electron beam passing through the second shaping aperture 230 has different energy intensity, as shown in FIG. 4B. Further, since the writing time of the VSB writer is proportional to the number of shots, the writing time can be reduced and the throughput of the reticle 310 can be increased. Accordingly, operation cost can be reduced and yield can be improved due to less shots and the writing time. It is to be noted that if the pattern P of FIG. 9 is formed by projections of electron beams with uniform energy distribution using a traditional apparatus/method, at least five beams/shots are used in order to respectively form four rectangular edge regions and one square main region.

In the following description, other methods of forming the pattern P of FIG. 9 will be described.

Figure 10A:
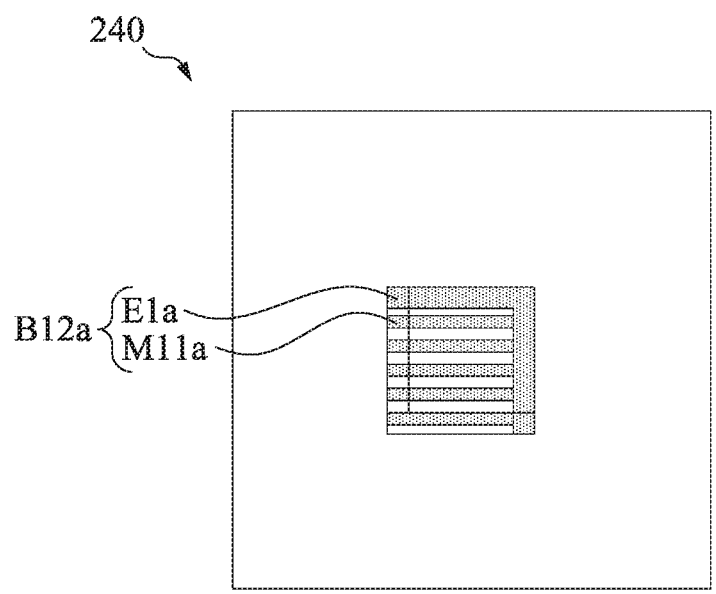
FIG. 10A is a top view of an electron beam transmitted to a third shaping aperture in accordance with some embodiments of the present disclosure.
Figure 10B:
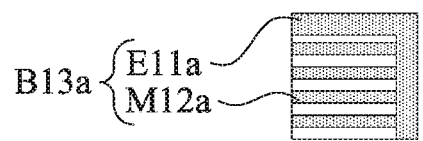
FIG. 10B is top view of the electron beam of FIG. 10A after passing through the third shaping aperture.

Reference is made to FIG. 10A. The formation of an electron beam B12a of FIG. 10A is similar to that of the electron beam B12 described above from FIGS. 3A to 4B, and will not be repeated. The electron beam B12a is transmitted to the third shaping aperture 240. The electron beam B12a has the main region M11a and the edge region E1a. After the electron beam B12a passes through the third shaping aperture 240, the remaining portion of the electron beam B12a, such as the electron beam B13a of FIG. 10B, is continuously transmitted toward the reticle 310 of FIG. 2. In some embodiments, the size of the electron beam B13a of FIG. 10B is greater than the size of the electron beam B13 of FIG. 5B because the relative position of the electron beam B12a and the third shaping aperture 240 of FIG. 10A is different from that of the electron beam B12 and the third shaping aperture 240 of FIG. 5A. The path of the electron beam B12a may be controlled by the radiation source 210 of FIG. 2 such that most portions of the electron beam B12a can pass through the shaping aperture 240 to form the electron beam B13a of FIG. 10B larger than the electron beam B13 of FIG. 5B.

Reference is made to FIG. 2 and FIG. 10B. The electron beam B13a is projected onto the reticle 310, such that the reticle 310 is exposed to the main region M12a and the edge region E11a of the electron beam B13a to create a pattern. In some embodiments, when the transmissive rate of the barrier structure 234 of the second shaping aperture 230 is about 50%, the main region M12a of the electron beam B13a can project about 50% (energy) dosage on a position of the reticle 310, and the edge region E11a of the electron beam B13a can project about 100% dosage on another position of the reticle 310, in which the electron beam B13a may irradiates the reticle 310 about 20 s.

Figure 11A:
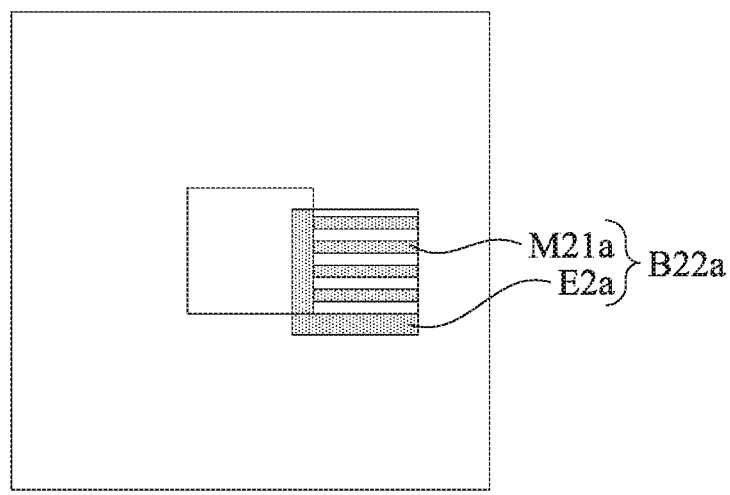
FIG. 11A is a top view of another electron beam transmitted to the third shaping aperture in accordance with some embodiments of the present disclosure.
Figure 11B:
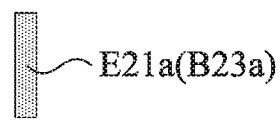
FIG. 11B is a top view of the electron beam of FIG. 11A after passing through the third shaping aperture.

Reference is made to FIG. 11A. The formation of another electron beam B22a of FIG. 11A is similar to that of the electron beam B22 described above from FIGS. 6A to 6B, and will not be repeated. The electron beam B22a is transmitted to the third shaping aperture 240. The electron beam B22a has the main region M21a and the edge region E2a. In some embodiments, a portion of the edge region E2a of the electron beam B22a can pass through the third shaping aperture 240. As a result, the remaining portion of the electron beam B22a, such as the electron beam B23a of FIG. 11B, is continuously transmitted toward the reticle 310 of FIG. 2. In some embodiments, the length of the electron beam B23a of FIG. 10B is similar to that of the electron beam B23 of FIG. 7B.

Reference is made to FIG. 2 and FIG. 11B. The edge region E21a of the electron beam B23a is projected onto the reticle 310, such that the reticle 310 is exposed to the edge region E21a to create a pattern. This exposure creates another pattern on the reticle 310. In some embodiments, the edge region E21a of the electron beam B23a projects about 50% dosage on a position of the reticle 310, in which the electron beam B23a may irradiates the reticle 310 about 10 s (i.e., a half of about 20 s).

Figures 12A, 12B:
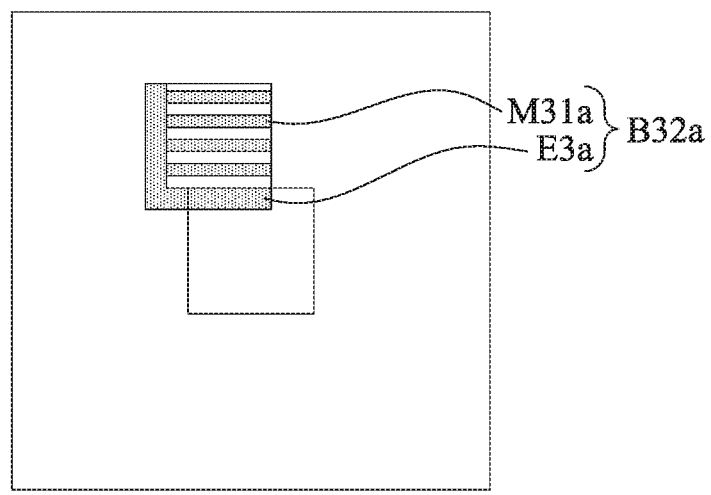
FIG. 12A is a top view of another electron beam transmitted to the third shaping aperture in accordance with some embodiments of the present disclosure.
FIG. 12B is a top view of the electron beam of FIG. 12A after passing through the third shaping aperture.

Reference is made to FIG. 12A. The formation of another electron beam B32a is similar to that of to that of the electron beam B22 described above from FIGS. 6A to 6B, and will not be repeated. However, the electron beam B32a is projected on a different position of the third shaping aperture 240 (e.g., an upper region) from the electron beam B22a of FIG. 11A (e.g., a right region). The electron beam B32a has the main region M31a and the edge region E3a. In some embodiments, a portion of the edge region E3a of the electron beam B32a can pass through the third shaping aperture 240. As a result, the remaining portion of the electron beam B32a, such as the electron beam B33a of FIG. 12B, is continuously transmitted toward the reticle 310 of FIG. 2. In some embodiments, the length of the electron beam B33a of FIG. 12B is smaller than that of the electron beam B31 of FIG. 8B because the relative position of the electron beam B32a and the third shaping aperture 240 of FIG. 12A is different from that of the electron beam B32 and the third shaping aperture 240 of FIG. 8A. The path of the electron beam B32a may be controlled by the radiation source 210 of FIG. 2 such that a portion of the edge region E3a passes through the shaping aperture 240 to form the electron beam B33a of FIG. 12B shorter than the electron beam B33 of FIG. 8B. In some embodiments, the edge region E31a of the electron beam B33a projects about 50% dosage on a position of the reticle 310, in which the electron beam B33a may irradiates the reticle 310 about 10 s (i.e., a half of about 20 s).

Figure 13:
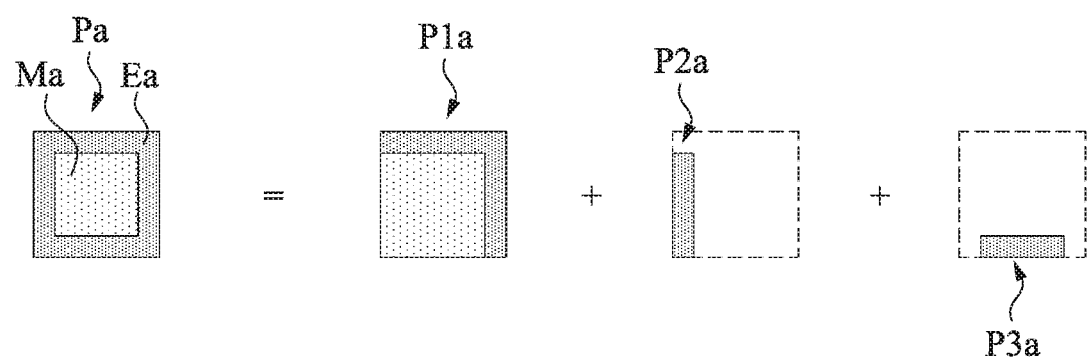
FIG. 13 is schematic view of a combination of patterns formed by electron beams of FIGS. 10B, 11B, and 12B.

FIG. 13 is schematic view of a combination of patterns P1a, P2a, and P3a formed by the electron beams B13a, B23a, and B33a of FIGS. 10B, 11B, and 12B. As mentioned above, there are three shots of the radiation source 210 (see FIG. 2) to respectively create three patterns P1a, P2a, and P3a on the reticle 310 of FIG. 2, in which the pattern P1a is formed by the electron beam B13a of FIG. 10B, the pattern P2a is formed by the electron beam B23a of FIG. 11B, and the pattern P3a is formed by the electron beam B33a of FIG. 12B. The path of the electron beam B23a may be controlled by the radiation source 210, such that the orthogonal projection of the edge region E21a of the electron beam B23a on the reticle 310 overlaps the orthogonal projection of the main region M12a of the electron beam B13a on the reticle 310. For example, the orthogonal projection of the edge region E21a of the electron beam B23a on the reticle 310 overlaps the left side of the pattern P1a. Moreover, the path of the electron beam B33a may be controlled by the radiation source 210, such that the orthogonal projection of the edge region E31a of the electron beam B33a on the reticle 310 overlaps the orthogonal projection of the main region M12a of the electron beam B13a on the reticle 310, and is adjacent to the orthogonal projection of the edge region E21a of the electron beam B23a on the reticle 310. For example, the orthogonal projection of the edge region E31a of the electron beam B33a on the reticle 310 overlaps the lower side of the pattern P1a.

As a result, a pattern Pa including the patterns P1a, P2a, and P3a of FIG. 13 is substantially the same as the pattern P of FIG. 9, and is formed in the photoresist layer 316 on the reticle 310 of FIG. 2 by the aforementioned three shots. The pattern Pa has a main region Ma and an edge region Ea that surrounds the main region Ma. The edge region Ea is formed by the projections of the edge region E11a of FIG. 10B, a portion of the main region M12a of FIG. 10B, the edge region E21a of FIG. 11B, and the edge region E31a of FIG.

12B, while the main region Ma is formed by the projection of the main region M12a of FIG. 10B. Due to the second shaping aperture 230 (see FIG. 4A), the main region M12a has energy intensity less than the energy intensity of the edge region E11a. In some embodiments, each of the edge region E21a and the edge region E31a has energy intensity substantially the same as the energy intensity of the main region M12a to enhance the energy intensity of the left and lower sides of the main region M12a. As a result, the pattern Pa with edge enhancement intensity distribution can be obtained, and thus the contrast of the image can be increased.

In the following description, other methods of forming the pattern P of FIG. 9 or the pattern Pa of FIG. 13 will be described.

Figure 14A:
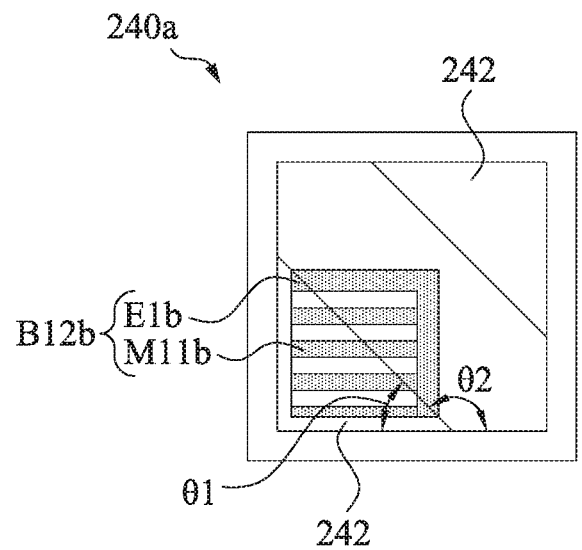
FIG. 14A is a top view of an electron beam transmitted to a third shaping aperture in accordance with some embodiments of the present disclosure.
Figure 14B:
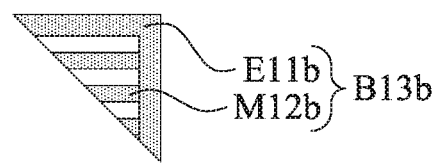
FIG. 14B is a top view of the electron beam of FIG. 14A after passing through the third shaping aperture of FIG. 14A.

Reference is made to FIG. 14A. The formation of an electron beam B12b of FIG. 14A is similar to that of the electron beam B12 described above from FIGS. 3A to 4B, and will not be repeated. The electron beam B12b is transmitted to a third shaping aperture 240a that is different from the aforementioned third shaping aperture 240. The third shaping aperture 240a has two triangular blocking structures 242 and an opening between the two blocking structures 242. In some embodiments, an angle θ1 is in a range from about 40 degrees to about 50 degrees, such as about 45 degrees. In other words, an angle θ2 is in a range from about 130 degrees to about 140 degrees, such as about 135 degrees. Such a design can obtain an triangular electron beam after the electron beam B12b passes through the third shaping aperture 240a. The electron beam B12b has the main region M11b and the edge region E1b. After the electron beam B12b passes through the third shaping aperture 240a, the remaining portion (e.g., an upper right portion) of the electron beam B12b, such as the electron beam B13b of FIG. 14B, is continuously transmitted toward the reticle 310 of FIG. 2. In some embodiments, the size of the electron beam B13b of FIG. 14B is substantially a half of the size of the electron beam B13a of FIG. 10B because of the relative position of the electron beam B12b and the third shaping aperture 240a of FIG. 14A. The path of the electron beam B12b may be controlled by the radiation source 210 of FIG. 2 such that a half of the electron beam B12b can pass through the shaping aperture 240a to form the electron beam B13b of FIG. 13B.

Reference is made to FIG. 2 and FIG. 14B. The electron beam B13b is projected onto the reticle 310, such that the reticle 310 is exposed to the main region M12b and the edge region E11b of the electron beam B13b to create a pattern. In some embodiments, when the transmissive rate of the barrier structure 234 of the second shaping aperture 230 is about 50%, the main region M12b of the electron beam B13b can project about 50% (energy) dosage on a position of the reticle 310, and the edge region E11b of the electron beam B13b can project about 100% dosage on another position of the reticle 310, in which the electron beam B13b may irradiates the reticle 310 about 20 s.

Figure 15A:
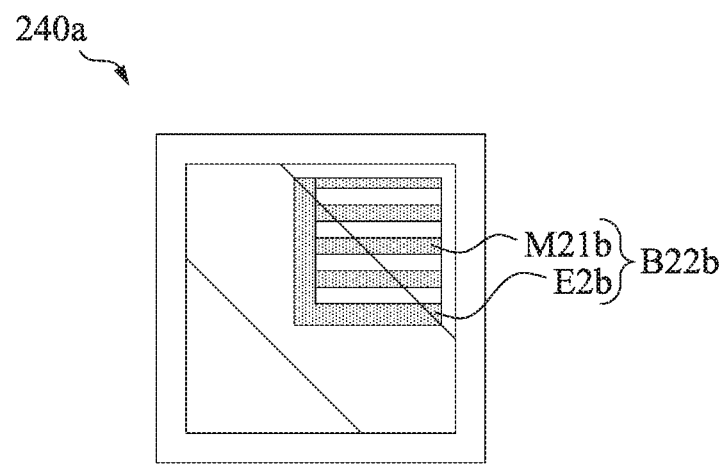
FIG. 15A is a top view of another electron beam transmitted to the third shaping aperture of FIG. 14A in accordance with some embodiments of the present disclosure.
Figure 15B:
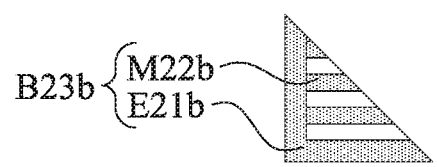
FIG. 15B is a top view of the electron beam of FIG. 15A after passing through the third shaping aperture of FIG. 14A.

Reference is made to FIG. 15A. The formation of another electron beam B22b of FIG. 15A is similar to that of the electron beam B22 described above from FIGS. 6A to 6B, and will not be repeated. The electron beam B22b is transmitted to the third shaping aperture 240a. The electron beam B22b has the main region M21b and the edge region E2b. In some embodiments, a portion of the electron beam B22b can pass through the third shaping aperture 240a. As a result, the remaining portion (e.g., an lower left portion) of the electron beam B22b, such as the electron beam B23b of FIG. 15B, is continuously transmitted toward the reticle 310 of FIG. 2. In some embodiments, the size of the electron beam B23b of FIG. 15B is substantially the same as that of the electron beam B13b of FIG. 14B.

Reference is made to FIG. 2 and FIG. 15B. The edge region E21b of the electron beam B23b is projected onto the reticle 310, such that the reticle 310 is exposed to the main region M22b and the edge region E21b of the electron beam B23b to create a pattern. This exposure creates another pattern on the reticle 310. In some embodiments, the main region M22b of the electron beam B23b can project about 50% (energy) dosage on a position of the reticle 310, and the edge region E21b of the electron beam B23b can project about 100% dosage on another position of the reticle 310, in which the electron beam B23b may irradiates the reticle 310 about 20 s.

Figure 16:
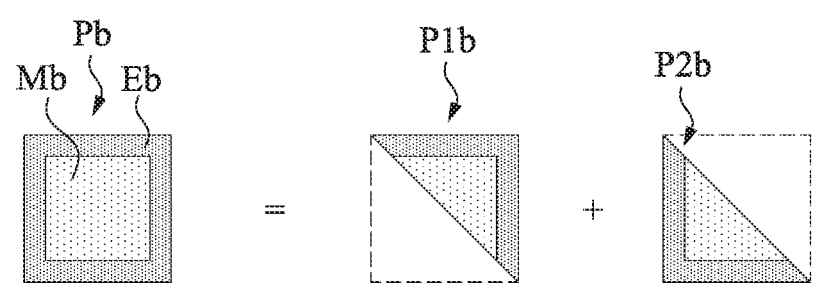
FIG. 16 is a schematic view of a combination of patterns formed by electron beams of FIGS. 14B and 15B.

FIG. 16 is schematic view of a combination of patterns P1b and P2b formed by the electron beams B13b and B23a of FIGS. 14B and 15B. As mentioned above, there are two shots of the radiation source 210 (see FIG. 2) to respectively create two patterns P1b and P2b on the reticle 310 of FIG. 2, in which the pattern P1b is formed by the electron beam B13b of FIG. 14B, and the pattern P2b is formed by the electron beam B23b of FIG. 15B. The path of the electron beam B23b may be controlled by the radiation source 210, such that orthogonal projections of the edge region E21b and the main region M22b of the electron beam B23b on the reticle 310 are respectively adjacent to orthogonal projections of the edge region E11b and the main region M12b of the electron beam B13b on the reticle 310. For example, the orthogonal projection of the electron beam B23b on the reticle 310 has a sloping side adjoining a sloping side of the orthogonal projection of the electron beam B13b on the reticle 310.

As a result, a pattern Pb including the patterns P1b and P2b of FIG. 16 is substantially the same as the pattern P of FIG. 9 and the pattern Pa of FIG. 13, and is formed in the photoresist layer 316 on the reticle 310 of FIG. 2 by the aforementioned two shots. The pattern Pb has a main region Mb and an edge region Eb that surrounds the main region Mb. The edge region Eb is formed by the projections of the edge region E11b of FIG. 14B and the edge region E21b of FIG. 15B, while the main region Mb is formed by the projections of the main region M12b of FIG. 14B and the main region M22b of FIG. 15B. Due to the second shaping aperture 230 (see FIG. 4A), the main region M12b and the main region M22b have energy intensity less than the energy intensity of the edge region E11b and E21b. As a result, the pattern Pb with edge enhancement intensity distribution can be obtained, and thus the contrast of the image can be increased.

In the following description, the structure of the second shaping aperture 230 of FIG. 4A will be described.

Figure 17:
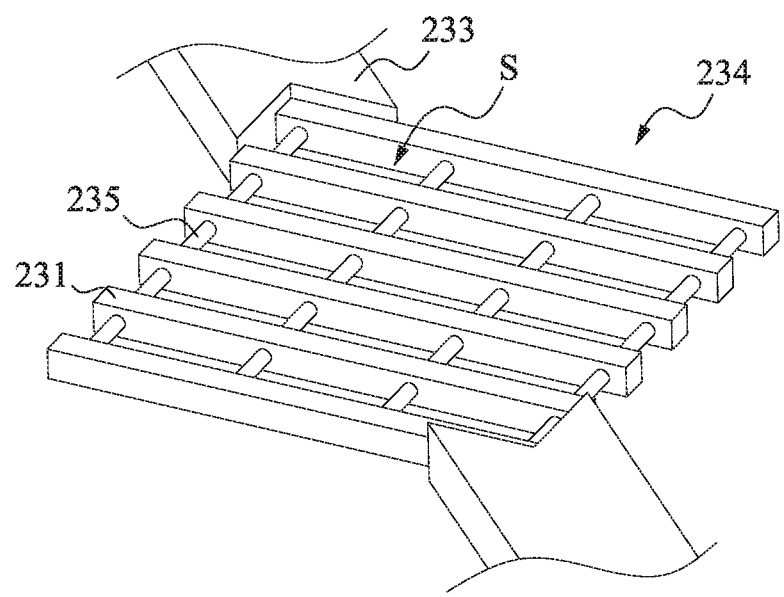
FIG. 17 is a partially perspective view of the second shaping aperture of FIG. 4A.

FIG. 17 is a partially perspective view of the second shaping aperture 230 of FIG. 4A. The second shaping aperture 230 has the barrier structure 234 supported by the diagonal support 233. The barrier structure 234 includes the conductive strips 231 and the slots S. At least one of the conductive strips 231 adjoins the diagonal support 233. Each of the slots S is between two adjacent conductive strips 231. Moreover, the second shaping aperture 230 further includes connecting elements 235 in the slots S. Two ends of each connecting element 235 respectively adjoin two adjacent conductive strips 231 for fixing the conductive strips 231. Therefore, the barrier structure 234 can be supported by the diagonal support 233 even if few of the conductive strips 231 connect the diagonal support 233.

Figure 18:
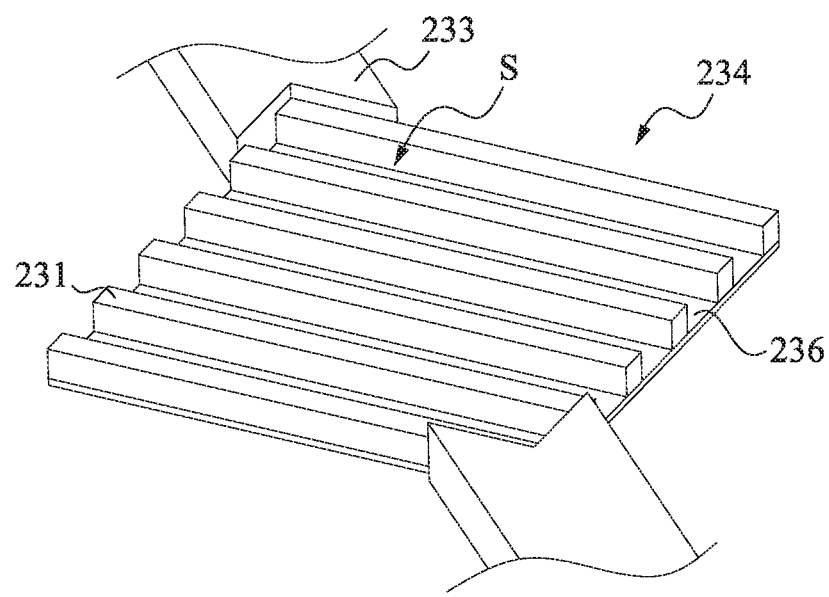
FIG. 18 is a partially perspective view of a second shaping aperture in accordance with some embodiments of the present disclosure.

FIG. 18 is a partially perspective view of a second shaping aperture 230a in accordance with some embodiments of the present disclosure. The difference between the second shaping aperture 230a and the second shaping aperture 230 of FIG. 17 is that the second shaping aperture 230a has no connecting elements 235 but further includes a membrane 236 below the conductive strips 231. The membrane 236 can support some of the conductive strips 231 that do not adjoin the diagonal support 233. In addition, the membrane 236 has a lower atomic number than the overlying conductive strips 231 to scatter electron beams. In some embodiments, the membrane 236 is made of a material including chromium (Cr) or the like, in which the atomic number of chromium is less than that of tungsten. For example, the membrane 236 includes a silicon nitride (SiNx) film with a deposition of Cr, in which a thickness of SiNx may be in a range from about 50 nm to about 150 nm, and a thickness of Cr is in a range from about 5 nm to about 20 nm. In addition, the conductive strips 231 have a thickness in a range from about 30 nm to about 50 nm.

Figure 19:
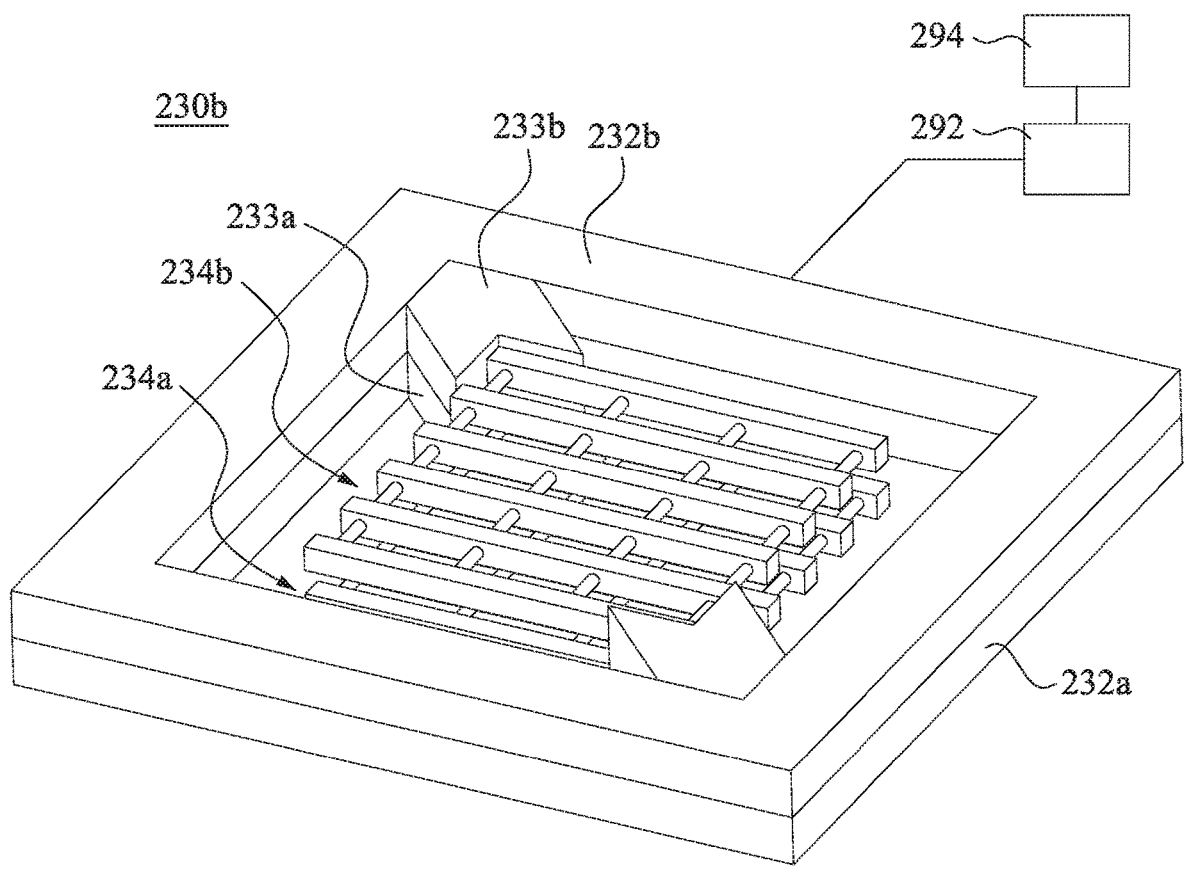
FIG. 19 is a perspective view of a second shaping aperture in accordance with some embodiments of the present disclosure.

FIG. 19 is a perspective view of a second shaping aperture 230b in accordance with some embodiments of the present disclosure. The second shaping aperture 230b has two stacked second shaping apertures 230 of FIGS. 4A and 17. In some embodiments, the second shaping aperture 230b includes a lower barrier structure 234a and an upper barrier structure 234b. Moreover, the semiconductor apparatus 200 (see FIG. 2) further includes a motor 292 and a control unit 294 electrically coupled to the motor 292. The motor 292 is connected to a frame 232b, and is controlled by the control unit 294 to move the frame 232b. Therefore, the upper barrier structure 234a can be moved relative to the lower barrier structure 234b.

Figure 20:
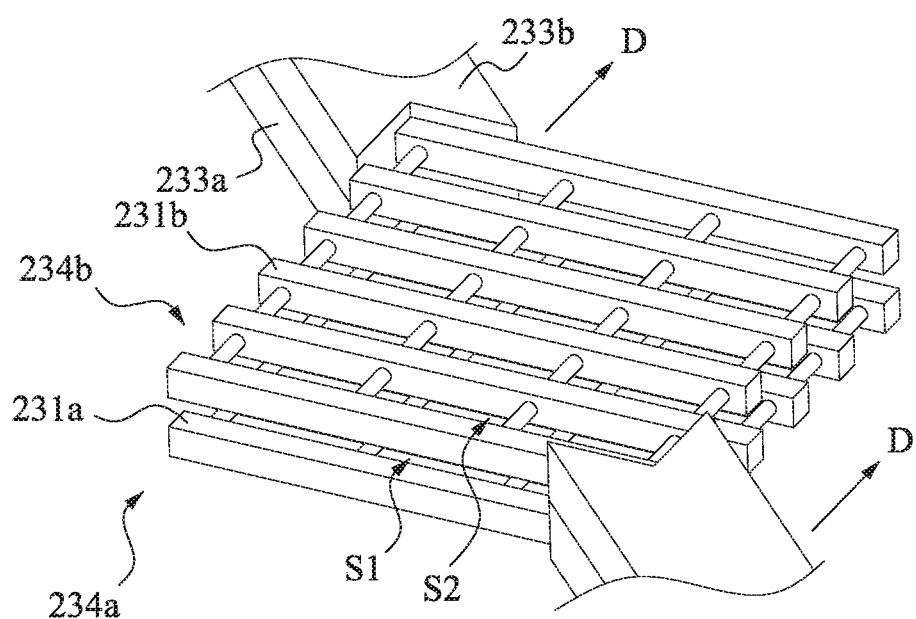
FIG. 20 is a partially perspective view of the second shaping aperture of FIG. 19.
Figure 21:
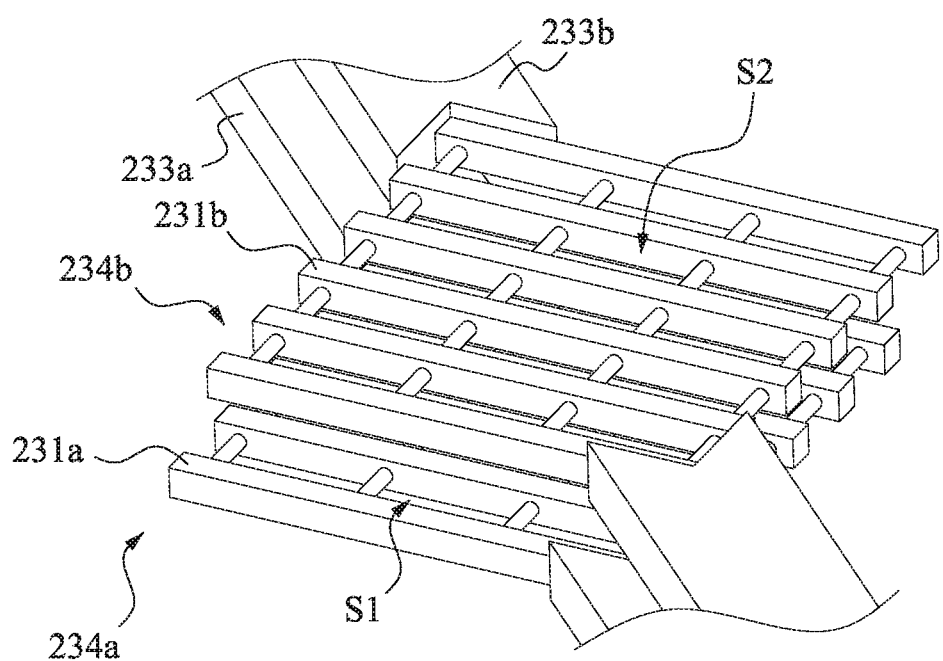
FIG. 21 is a partially perspective view of the second shaping aperture of FIG. 20 after upper conductive strips are moved relative to lower conductive strips.

FIG. 20 is a partially perspective view of the second shaping aperture 230b of FIG. 19. The upper barrier structure 234b includes conductive strips 231b, and the lower barrier structure 234a includes conductive strips 231a. The conductive strips 231b are above the conductive strips 231a. Slots S1 are between the conductive strips 231a, and slots S2 are between the conductive strips 231b. The diagonal support 233a supports the conductive strips 231a, and the diagonal support 233b supports the conductive strips 231b. In some embodiments, when the frame 232b is driven by the motor 292, the conductive strips 231b of the upper barrier structure 234b along with the diagonal support 233b can move relative to the conductive strips 231a of the lower barrier structure 234b. For example, the conductive strips 231b are movably above the conductive strips 231a in a direction D. After the conductive strips 231b move for a distance, the structure of FIG. 21 may be obtained.

Figure 22A:
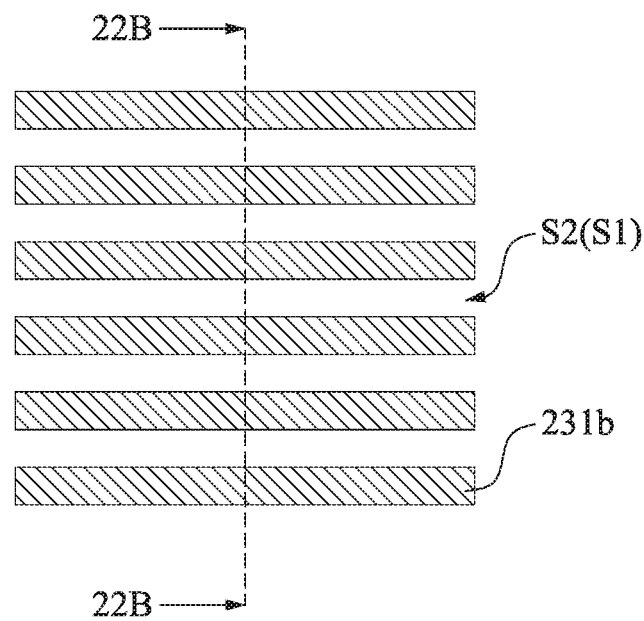
FIG. 22A is a top view of the conductive strips of FIG. 20, in which transmissive rate is about 50%.
Figure 22B:
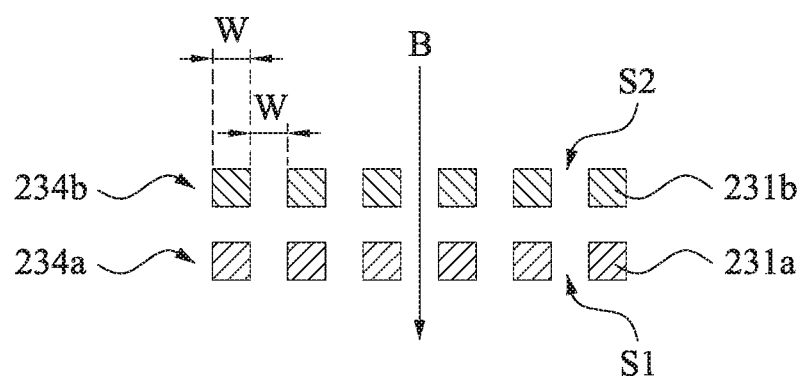
FIG. 22B is a cross-sectional view of the conductive strips taken along line 22B-22B of FIG. 22A.

FIG. 22A is a top view of the conductive strips 231a and 231b of FIG. 20, in which transmissive rate is about 50%. FIG. 22B is a cross-sectional view of the conductive strips 231a and 231b taken along line 22B-22B of FIG. 22A. As shown in FIGS. 22A and 22B, the conductive strips 231a are respectively covered by the conductive strips 231b. In some embodiments, the conductive strips 231a, the slots S1, the conductive strips 231b and the slots S2 have the substantially same width W, and thus the lower barrier structures 234a and the upper barrier structure 234b have 1:1 width/ space ratio. When the conductive strips 231a and 231b are in the state of FIG. 22B, the combination of the conductive strips 231a and 231b (i.e., the lower barrier structure 234a and the upper barrier structure 234b) of the second shaping aperture 230b has about 50% transmissive rate substantially the same as the barrier structure 234 of FIGS. 4A and 17. That is, the energy intensity of an electron beam B passing through the barrier structures 234a and 234b is reduced about 50% (energy) dosage to transmit toward the underlying components, such as the third shaping aperture 240 and the reticle 310 of FIG. 2.

Figure 23A:
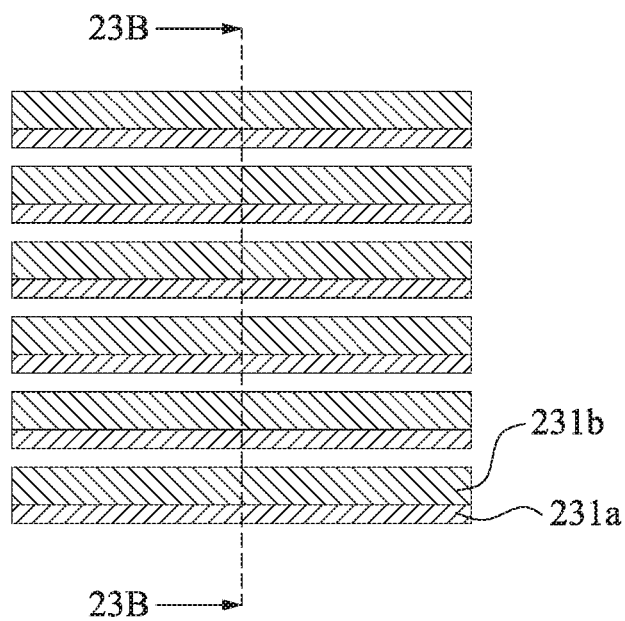
FIG. 23A is a top view of the conductive strips of FIG. 20 after the upper conductive strips are moved, in which transmissive rate is about 25%.
Figure 23B:
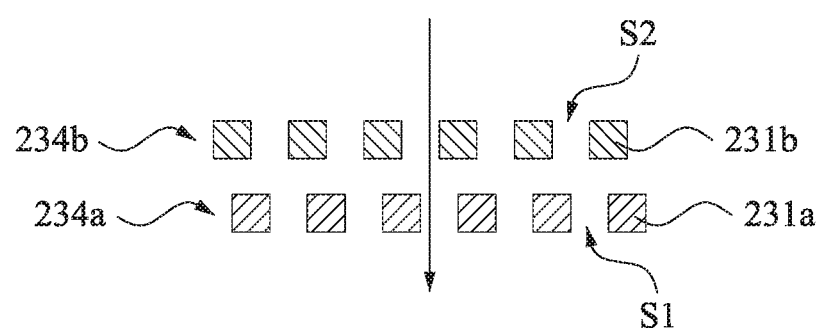
FIG. 23B is a cross-sectional view of the conductive strips taken along line 23B-23B of FIG. 23A.

Reference is made to FIGS. 23A and 23B. After the conductive strips 231b of the upper barrier structure 234b is moved relative to the underlying conductive strips 231a for a distance (e.g., ½ width W), the conductive strips 231b can partially cover the slots S1 between the conductive strips 231a. In some embodiments, a half of each slot S1 is covered by the corresponding conductive strip 231b. When the conductive strips 231a and 231b are in the state of FIG. 23B, the combination of the conductive strips 231a and 231b (i.e., the barrier structures 234a and 234b) of the second shaping aperture 230b has about 25% transmissive rate. In other words, the energy intensity of the electron beam B passing through the barrier structures 234a and 234b is reduced to about 25% dosage to transmit toward the underlying components.

Figure 24A:
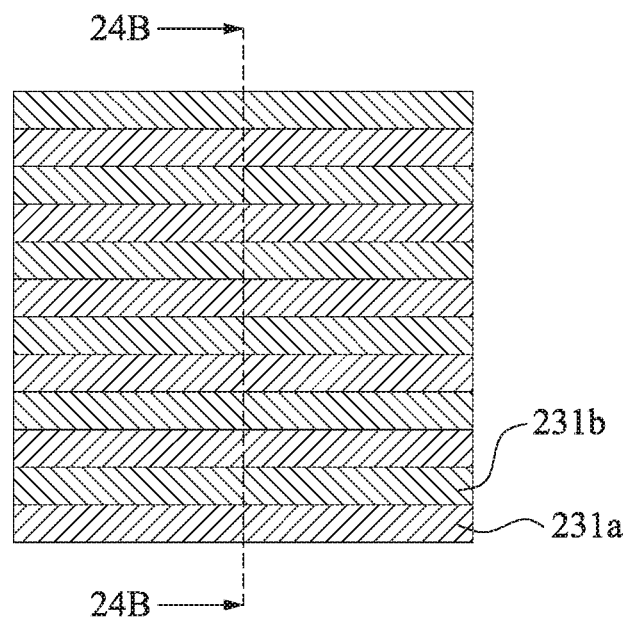
FIG. 24A is a top view of the conductive strips of FIG. 20 after the upper conductive strips are moved, in which transmissive rate is about 0%.
Figure 24B:
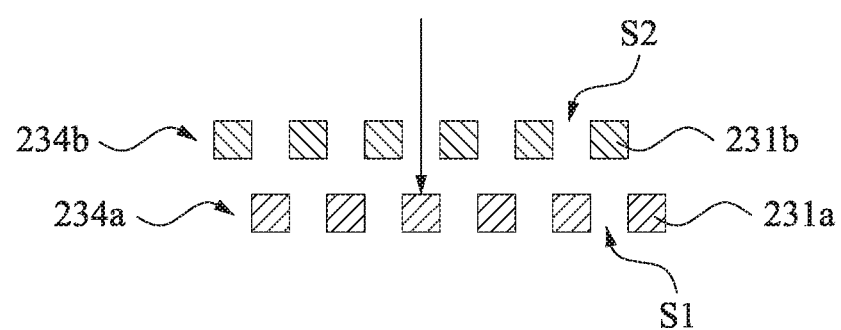
FIG. 24B is a cross-sectional view of the conductive strips taken along line 24B-24B of FIG. 24A.

Reference is made to FIGS. 24A and 24B. After the conductive strips 231b of the upper barrier structure 234b is moved relative to the underlying conductive strips 231a for a distance (e.g., the width W), the conductive strips 231b can respectively cover the slots S1 between the conductive strips 231a. When the conductive strips 231a and 231b are in the state of FIG. 24B, the combination of the conductive strips 231a and 231b (i.e., the barrier structures 234a and 234b) of the second shaping aperture 230b has about 0% transmissive rate. That is, the energy intensity of the electron beam B passing through the barrier structures 234a and 234b is reduced to about 0% dosage to transmit toward the underlying components. Stated differently, the electron beam B has no portion passing through the barrier structures 234a and 234b. The second shaping aperture 230b including the barrier structures 234a and 234b can modify the energy distribution of electron beams with different energy intensity, thereby increasing design convenience.

In some embodiments, the semiconductor apparatus and the method of operating the same may be used in a variable shaped beam (VSB) charged particle writing system. The semiconductor apparatus can modify an energy distribution of an electron beam by a shaping aperture that includes a barrier structure. Due to the barrier structure, the electron beam passing through the shaping aperture would have a main region and an edge region having a greater energy than the main region. After the edge region and the main region of the electron beam are projected onto a reticle, a pattern with edge enhancement intensity distribution can be obtained, and thus the contrast of the pattern can be increased.

According to some embodiments, a method of operating a semiconductor apparatus includes forming a first electron beam passing through a first shaping aperture; modifying an energy distribution of the first electron beam by a second shaping aperture, such that the first electron beam has a main region and an edge region having a greater energy than the main region; and exposing a reticle to the main region and the edge region of the first electron beam to create a pattern.

According to some embodiments, a method of operating a semiconductor apparatus includes forming a first electron beam passing through a first shaping aperture, wherein the first electron beam has a main region and an edge region; reducing an energy intensity of the main region of the first electron beam by a second shaping aperture; maintaining an energy intensity of the edge region of the first electron beam by the second shaping aperture ; and exposing a reticle to the main region and the edge region of the first electron beam to create a pattern.

According to some embodiments, a semiconductor apparatus includes a radiation source, a first shaping aperture, and a second shaping aperture. The radiation source is configured to generate an electron beam. The first shaping aperture is below the radiation source, and a portion of the electron beam passes through the first shaping aperture. The second shaping aperture is below the first shaping aperture, and has a barrier structure configured to modify an energy distribution of the portion of the first electron beam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not de depart from the spirit and scope of the present disclosure, and that they may make various changes, substitutions, and alterations herein without departing from the spirit and scope of the present disclosure.

What is claimed is:

1. A method comprising:
forming a first electron beam passing through a first shaping aperture;
modifying an energy distribution of the first electron beam by a second shaping aperture, such that the first electron beam has a main region and an edge region having a greater energy intensity than that of the main region, wherein modifying the energy distribution of the first electron beam comprises:
maintaining the energy intensity of the edge region of the first electron beam by an L-shaped opening of the second shaping aperture; and
exposing a workpiece to the main region and the edge region of the first electron beam to create a pattern.

2. The method of claim 1, wherein modifying the energy distribution of the first electron beam comprises:
reducing an energy intensity of the main region of the first electron beam by a plurality of slots of the second shaping aperture.

3. The method of claim 1, wherein the second shaping aperture has a plurality of conductive strips, and modifying the energy distribution of the first electron beam comprises:
partially blocking the main region of the first electron beam by the conductive strips.

4. The method of claim 1, wherein the second shaping aperture has a plurality of first conductive strips and second conductive strips above the first conductive strips, and modifying the energy distribution of the first electron beam comprises:
moving the second conductive strips relative to the first conductive strips to partially cover a plurality of slots between the first conductive strips.

5. The method of claim 1, further comprising:
enabling a portion of the main region and a portion of the edge region of the first electron beam to pass through a third shaping aperture.

6. The method of claim 5, wherein exposing the workpiece to the main region and the edge region of the first electron beam comprises:
projecting the portion of the main region and the edge region of the first electron beam onto the workpiece.

7. The method of claim 5, further comprising:
forming a second electron beam passing through the first shaping aperture, the second shaping aperture, and the third shaping aperture, such that an edge region of the second electron beam is projected onto the workpiece.

8. The method of claim 7, further comprising:
controlling a path of the second electron beam such that an orthogonal projection of the edge region of the second electron beam on the workpiece is adjacent to an orthogonal projection of the main region and the edge region of the first electron beam on the workpiece.

9. The method of claim 7, further comprising:
controlling a path of the second electron beam such that an orthogonal projection of the edge region of the second electron beam on the workpiece overlaps an orthogonal projection of the main region of the first electron beam on the workpiece.

10. The method of claim 9, further comprising:
forming a third electron beam passing through the first shaping aperture, the second shaping aperture, and the third shaping aperture; and
controlling a path of the third electron beam such that an orthogonal projection of an edge region of the third electron beam on the workpiece overlaps the orthogonal projection of the main region of the first electron beam on the workpiece.

11. The method of claim 7, further comprising:
controlling a path of the second electron beam such that orthogonal projections of the edge region and the main region of the second electron beam on the workpiece are respectively adjacent to orthogonal projections of the edge region and the main region of the first electron beam on the workpiece.

12. The method of claim 1, wherein exposing the workpiece to the main region and the edge region of the first electron beam to create the pattern comprises:
receiving the first electron beam that passes through the first shaping aperture and the second shaping aperture by a photoresist layer over the workpiece.

13. A method comprising:
forming a first electron beam passing through a first shaping aperture, wherein the first electron beam has a main region and an edge region;
reducing an energy intensity of the main region of the first electron beam by a second shaping aperture, wherein reducing the energy intensity of the main region of the first electron beam comprises:
adjusting widths of a plurality of slots of the second shaping aperture to control the energy intensity of the main region of the first electron beam; and
enabling a portion of the main region of the first electron beam to pass through the slots of the second shaping aperture;
maintaining an energy intensity of the edge region of the first electron beam by the second shaping aperture ; and
exposing a workpiece to the main region and the edge region of the first electron beam to create a pattern.

14. The method of claim 13, wherein maintaining the energy intensity of the edge region of the first electron beam comprises:
enabling the edge region of the first electron beam to pass through an L-shaped opening of the second shaping aperture.

15. The method of claim 13, further comprising:
enabling the portion of the main region and a portion of the edge region of the first electron beam to pass through a third shaping aperture.

16. The method of claim 13, wherein exposing the workpiece to the main region and the edge region of the first electron beam comprises:
projecting the portion of the main region and the edge region of the first electron beam onto the workpiece.

17. An apparatus comprising:
a radiation source configured to generate an electron beam;
a first shaping aperture below the radiation source, wherein the first shaping aperture is configured to allow a portion of the electron beam to pass through the first shaping aperture; and
a second shaping aperture below the first shaping aperture, and having a barrier structure configured to modify an energy distribution of the portion of the electron beam, wherein the barrier structure of the second shaping aperture comprises a plurality of conductive strips with a plurality of slots therebetween, the slots are configured to allow a main region of the portion of the electron beam to pass through the slots, wherein the second shaping aperture comprises:
a frame surrounding the conductive strips; and
a diagonal support connected to the frame and one of the conductive strips, wherein an L-shaped opening is among the frame, the diagonal support, and the conductive strips, and the L-shaped opening is configured to allow an edge region of the portion of the electron beam to pass through the L-shaped opening.

18. The apparatus of claim 17, wherein the second shaping aperture comprises:
a plurality of first conductive strips having a plurality of first slots therebetween; and
a plurality of second conductive strips having a plurality of second slots therebetween, wherein the second conductive strips is movably above the first conductive strips.

19. The apparatus of claim 17, wherein the second shaping aperture comprises:
a plurality of connecting elements in the slots, wherein two ends of each connecting element respectively adjoin two adjacent ones of the conductive strips.

20. The apparatus of claim 17, comprising:
a membrane below the conductive strips, wherein the membrane has a lower atomic number than that of the conductive strips.

* * * * *